(12) United States Patent
Kim et al.

(10) Patent No.: US 6,870,776 B2
(45) Date of Patent: Mar. 22, 2005

(54) DATA OUTPUT CIRCUIT IN COMBINED SDR/DDR SEMICONDUCTOR MEMORY DEVICE

(75) Inventors: Chul-soo Kim, Kyungki-do (KR); Kyu-hyoun Kim, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/631,414

(22) Filed: Jul. 30, 2003

(65) Prior Publication Data

US 2004/0057322 A1 Mar. 25, 2004

(30) Foreign Application Priority Data

Sep. 19, 2002 (KR) ................................ 10-2002-0057454

(51) Int. Cl.⁷ ............................................. G11C 16/04
(52) U.S. Cl. ................... 365/189.05; 365/201; 365/233
(58) Field of Search ....................... 365/189.02, 189.04, 365/189.05, 230.01–230.04, 201, 220, 221, 233

(56) References Cited

U.S. PATENT DOCUMENTS 6,208,582 B1 * 3/2001 Kanda et al. ................ 365/233
6,549,470 B2 * 4/2003 Hardee et al. .......... 365/189.05
6,556,492 B2 * 4/2003 Ernst et al. .................. 365/201

FOREIGN PATENT DOCUMENTS

JP 2001-67870 3/2001
KR 1999-0037555 5/1999

OTHER PUBLICATIONS

English Language of Abstract of Korean Patent Publication No. 1999–0037555.
English Language of Abstract of Japanese Patent Publication No. 2001–67870.

* cited by examiner

Primary Examiner—Vibol Tan
(74) Attorney, Agent, or Firm—Marger Johnson & McCollom, P.C.

(57) ABSTRACT

A data output circuit includes first, second, third, and fourth data latches, and first and second data output drivers. The first, second, third, and fourth latches generate first pull-up signals, second pull-up signals, first pull-down signals, and second pull-down signals, respectively. In DDR mode, first and third latches latch even data in response to an even clock, while second and fourth latches latch odd data in response to an odd clock. In SDR mode, first and third latches latch first data in response to a data output clock, while second and fourth latches latch second data in response to the data output clock. The first and second data output drivers drive a first and second output pad, respectively, to predetermined voltages in response to the pull-up signals and the pull-down signals. The data output circuit reduces the number of data buffers, reducing the size of a semiconductor memory device.

21 Claims, 8 Drawing Sheets

DATA OUTPUT CIRCUIT IN COMBINED SDR/DDR SEMICONDUCTOR MEMORY DEVICE

CROSS REFERENCE TO RELATED APPLICATIONS

This application claims the priority of Korean Patent Application No. 2002-57454, filed Sep. 19, 2002 in the Korean Intellectual Property Office, which is hereby incorporated by reference in its entirety for all purposes.

BACKGROUND OF THE INVENTION

1. Field of the Invention

This disclosure relates to a semiconductor memory device, and more particularly, to a data output circuit in a combined single data rate/double data rate (SDR/DDR) synchronous semiconductor memory device.

2. Description of the Related Art

In general, synchronous semiconductor memory devices operate in an SDR mode where one bit of data is input/output for each data input/output pin during one clock cycle. However, in order to improve a data input/output rate, semiconductor memory devices that operate in a DDR where two bits of data are input/output for each data input/output pin during one clock cycle have been used.

A semiconductor memory device includes data output buffers, each of which is assigned with a data pin and includes a data output buffer and a data output driver, in order to externally output internal data, which are read from memory cells.

In conventional combined SDR/DDR semiconductor memory devices, since all data output buffers cannot be used as combined SDR/DDR data output buffers, the number of data output buffers increases and the efficiency of the data output buffers deteriorates.

FIG. 1 is a block diagram illustrating a data output circuit in a conventional combined SDR/DDR semiconductor memory device.

Referring to FIG. 1, the data output circuit includes a data output buffer 100 and a data output driver 200. Here, the data output buffer 100 includes four data latches 111 through 114 and two drivers 121 and 122.

It is assumed that the semiconductor memory device is operated in a DDR mode. In this case, the first and third data latches 111 and 113 latch even data D_E in response to an even clock CLK_E and convert the level of the latched data to output the data. Thus, the first and third data latches 111 and 113 latch the data to be output at the rising edge of a clock, and the second and fourth latches 112 and 114 latch the data to be output at the falling edge of the clock.

The drivers 121 and 122 drive the data received from the data latches 111 through 114 to output a pull-up control signal PB and a pull-down control signal NB.

The data output driver 200 includes a pull-up transistor PM1 and a pull-down transistor NM1.

Here, the pull-up transistor PM1 is formed of a PMOS transistor, and the pull-down transistor NM1 is formed of an NMOS transistor. The pull-up transistor PM1 and the pull-down transistor NM1 are gated in response to the pull-up control signal PB and the pull-down control signal NB, respectively, which are output from the data output buffer 100. The pull-up transistor PM1 is turned on when the pull-up control signal PB is at a low level to output an output data DQ of a high level. The pull-down transistor NM1 is turned on when the pull-down control signal NB is at a high level to output the output data DQ of a low level.

Meanwhile, it is assumed that the semiconductor memory device is operated in the SDR mode. In this case, the second and fourth data latches 112 and 114 are not used. In other words, the first and third data latches 111 and 113 latch data D1 at the rising edge of a data output clock CLKDQ and convert the level of the latched data to output the data.

The drivers 121 and 122 drive the data received from the data latches 111 through 114 to output the pull-up control signal PB and the pull-down control signal NB as in the case of the DDR mode.

The data output driver 200 outputs the output data DQ to the outside in response to the pull-up control signal PB and the pull-down control signal NB.

As described above, the conventional data output buffer 100 latches and outputs one bit of data in the SDR mode and two bits of data in the DDR mode.

Thus, the semiconductor memory device of SDR X16, which has 16 input/output pins and operates in the SDR mode, requires 16 data output buffers. When such a semiconductor memory device operates in the X8 DDR mode, the semiconductor memory device requires 9 data output buffers including a data strobe signal DQS buffer, which is used only in the DDR mode.

Therefore, in the conventional semiconductor memory device, some of the data output buffers are used as combined SDR/DDR data output buffers; however, the remaining data output buffers, for example, half of the data output buffers, are used as dedicated SDR data output buffers. In other words, the conventional semiconductor memory device requires a dedicated SDR data output circuit, in addition to the combined SDR/DDR data output circuit of FIG. 1.

FIG. 2 is a circuit diagram illustrating a combined SDR/DDR data output circuit in the conventional SDR/DDR semiconductor memory device, and FIG. 3 is a circuit diagram illustrating a dedicated SDR data output circuit in the conventional SDR/DDR semiconductor memory device. The conventional data output circuits will be described later in comparison with a data output circuit according to the present invention.

As a result, the conventional SDR/DDR semiconductor memory device requires equal number of data output buffers to the number of data input/output pins, and half of the data output buffers are used as the dedicated SDR data output buffers and are not available in the DDR mode.

Embodiments of the invention address these and other disadvantages in the conventional art.

SUMMARY OF THE INVENTION

Embodiments of the invention provide a data output circuit to reduce the number of data output buffers and reduce the size of a chip by merging the data output buffers in a combined single data rate/double data rate (SDR/DDR) semiconductor memory device.

BRIEF DESCRIPTION OF THE DRAWINGS

The above aspects and advantages of embodiments of the invention will become more apparent by describing in detail exemplary embodiments thereof with reference to the attached drawings.

DETAILED DESCRIPTION OF THE INVENTION

The invention will now be described more fully with reference to the accompanying drawings, in which preferred embodiments of the invention are shown.

Figure 4:
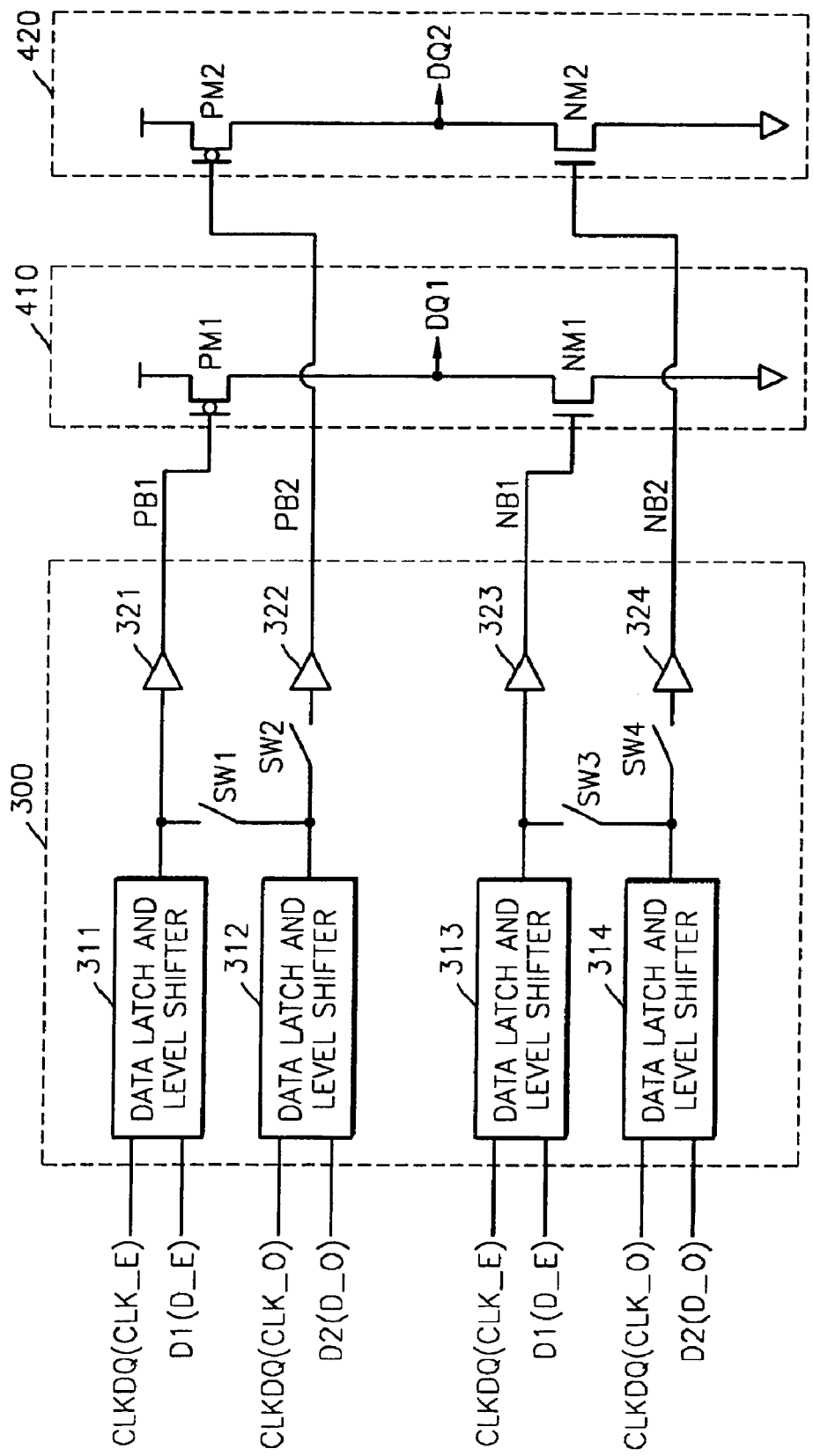
FIG. 4 is a block diagram illustrating a data output circuit in a combined SDR/DDR semiconductor memory device according to an embodiment of the invention.

FIG. 4 is a block diagram illustrating a data output circuit in a combined single data rate/double data rate (SDR/DDR) semiconductor memory device according to an embodiment of the invention. Referring to FIG. 4, the data output circuit includes a data output buffer 300 and first and second data output drivers 410 and 420. Here, the data output buffer 300 includes first through fourth data latches 311 through 314, first through fourth drivers 321 through 324, and a plurality of switches SW1 through SW4.

First, it is assumed that the semiconductor memory device is operated in an SDR mode. In this case, the first and third switches SW1 and SW3 are turned off and the second and fourth switches SW2 and SW4 are turned on.

The first through fourth data latches 311 through 314 latch first data D1 or second data D2, respectively, in response to a data output clock CLKDQ and convert the level of the latched data to output the data. Here, the data output clock CLKDQ is a clock signal that may be generated in response to the rising edge or falling edge of a clock. In this case, it is assumed that the data output clock CLKDQ is generated in response to the rising edge of the clock.

The first and third data latches 311 and 313 latch the first data D1, which will be output to a first data input/output pin (not shown) via the first data output driver 410. The second and fourth data latches 312 and 314 latch the second data D2, which will be output to a second data input/output pin (not shown) via the second data output driver 420.

The first through fourth drivers 321 through 324 pre-drive the data output from the first through fourth data latches 311 through 314, respectively, to output first and second pull-up control signals PB1 and PB2 and first and second pull-down control signals NB1 and NB2.

The first data output driver 410 drives a first output pad (not shown) in response to the first pull-up control signal PB1 and the first pull-down control signal NB1 to output one bit of output data DQ1, which is an SDR data, at the rising edge of the clock. In addition, the second data output driver 420 drives a second output pad (not shown) in response to the second pull-up control signal PB2 and the second pull-down control signal NB2 to output the other one bit of output data DQ2, which is an SDR data, at the rising edge of the clock.

As a result, the data output buffer 300 latches and outputs two bits of data, which will be output to two data input/output pins, at the same time in the SDR mode.

The structure of the first data output driver 410 will now be described in detail. The first data output driver 410 includes a pull-up transistor PM1 and a pull-down transistor NM1. Here, the pull-up transistor PM1 is formed of a PMOS transistor, and the pull-down transistor NM1 is formed of an NMOS transistor. The pull-up transistor PM1 is formed between an external source voltage and the output pad, and the pull-down transistor NM1 is formed between the ground and the output pad. The structure of the second data output driver 420 is the same as that of the first data output driver 410, and so description of the structure of the second data output driver 420 will not be repeated.

Meanwhile, it is assumed that the semiconductor memory device is operated in a DDR mode. In this case, the first and third switches SW1 and SW3 are turned on, and the second and fourth switches SW2 and SW4 are turned off.

The first and third data latches 311 and 313 latch even data D_E in response to an even clock CLK_E and convert the level of the latched data to output the data. The second and fourth data latches 312 and 314 latch odd data D_O in response to an odd clock CLK_O and convert the level of the latched data to output the data.

Here, the even clock CLK_E is a clock signal that is generated in response to the rising edge of a clock, and the odd clock CLK_O is a clock signal that is generated in response to the falling edge of the clock.

Since the second and fourth switches SW2 and SW4 are in an off state, the second and fourth drivers 322 and 324 do not operate. The first driver 321 receives data output from the first and second data latches 311 and 312 to output the first pull-up control signal PB1. The third driver 323 receives the data output from the third and fourth data latches 313 and 314 to output the first pull-down control signal NB1. Thus, the first pull-up control signal PB1 and the first pull-down control signal NB1 are generated at the rising edge and the falling edge of the clock, respectively.

The first data output driver 410 drives the first output pad (not shown) in response to the first pull-up control signal PB1 and the first pull-down control signal NB1 to output two bits of data, i.e., a DDR data, during one clock cycle. Here, the two bits of data include one bit of data at the rising edge of the clock and one bit of data at the falling edge of the clock.

In the block diagram of FIG. 4, the outputs of the first through fourth data latches 311 through 314 are input to proper data output drivers using the switches SW1 through SW4 in response to the DDR mode or the SDR mode.

Alternatively, instead of using the switches for interconnections, other types of interconnections can be used. For example, metal lines are formed to connect the outputs of the second and fourth data latches 312 and 314 to the first data output driver 410 through the first and third drivers 321 and 323 in the DDR mode. In addition, the metal lines are formed to connect the outputs of the second and fourth data latches 312 and 314 to the second data output driver 420 through the second and fourth drivers 322 and 324 in the SDR mode.

Figure 5:
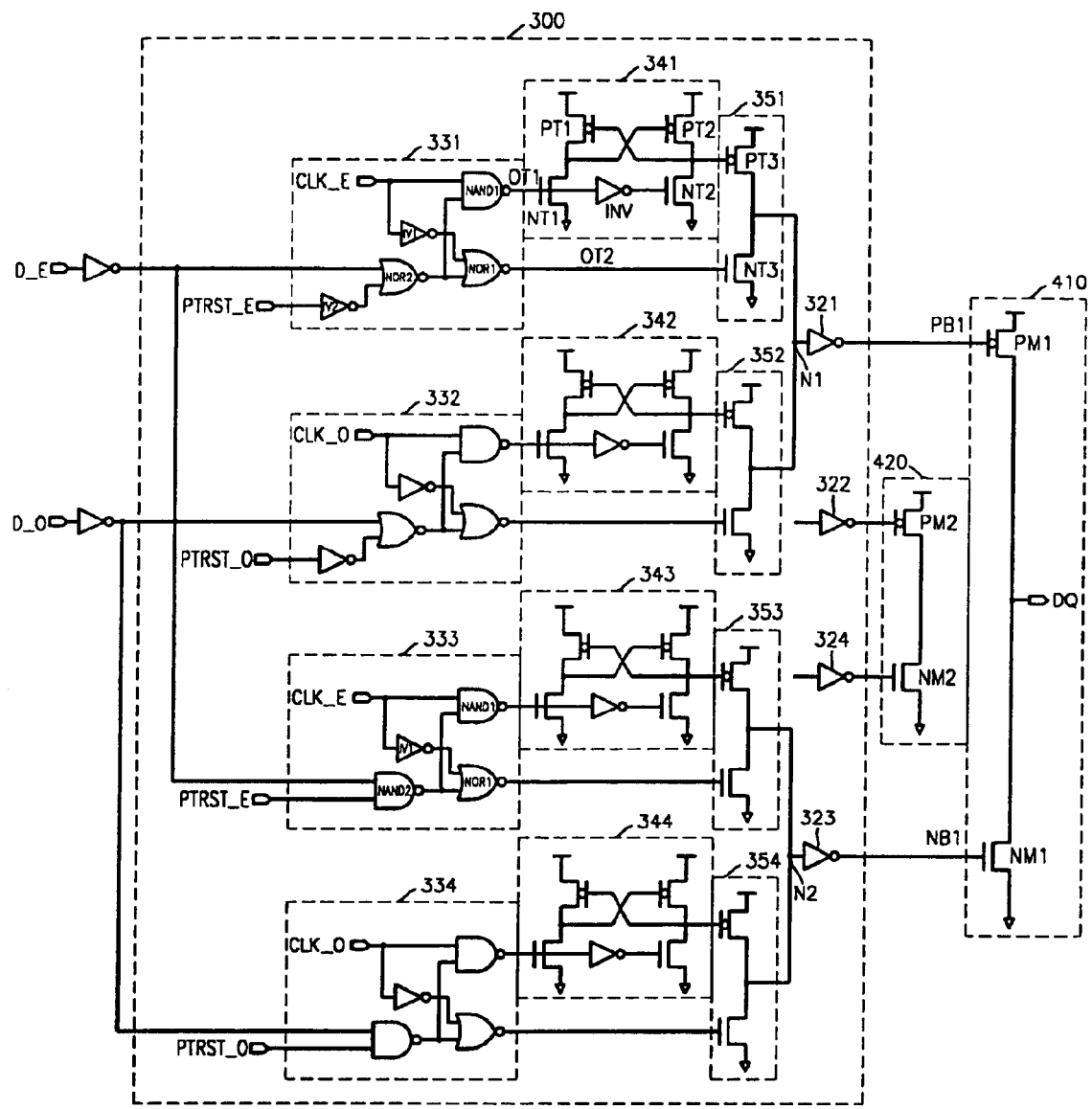
FIG. 5 is a circuit diagram illustrating a data output circuit for a DDR mode in a combined SDR/DDR semiconductor memory device according to the embodiment of the invention.

FIG. 5 is a circuit diagram illustrating a data output circuit for the DDR mode in the combined SDR/DDR semiconductor memory device according to an embodiment of the invention. In other words, the combined SDR/DDR data output circuit of FIG. 4 is set as the data output circuit for the DDR mode. Referring to FIGS. 4 and 5, the data output buffer 300 includes the first through fourth data latches 311 through 314 that include data latch devices 331 through 334, level conversion units 341 through 344, and buffers 351 through 354, respectively. In addition, since the data output circuit of FIG. 5 is dedicated to the DDR mode, the first data output driver 410 is connected to the data output buffer 300 via the first and third drivers 321 and 323; however, the second data output driver 420 is not connected to the data output buffer 300.

More specifically, the first data latch 311 includes the first data latch device 331, the first level conversion unit 341, and the first buffer 351.

The first data latch device 331 receives an even buffer control signal PTRST_E, the even clock CLK_E, and the even data D_E. Here, the even buffer control signal PTRST_E controls the output of the even data D_E. In other words, when the even buffer control signal PTRST_E is enabled to a predetermined level, i.e., a high level in the present invention, the effective even data D_E is output in response to the even clock CLK_E.

More specifically, the first data latch device 331 is formed of inverters IV1 and IV2, a NAND gate NAND1, and NOR gates NOR1 and NOR2. The inverter IV2 inverts the even buffer control signal PTRST_E. The NOR gate NOR2 performs an NOR operation on the inverted data of the even data D_E and the inverted signal of the even buffer control signal PTRST_E. The NAND gate NAND1 performs an NAND operation on the output of the even clock CLK_E and the output of the NOR gate NOR2 to output a first output signal OT1.

The NOR gate NOR1 performs a NOR operation on the inverted signal of the even clock CLK_E and the output of the NOR gate NOR2 to output a second output signal OT2.

The first level conversion unit 341 converts the internal voltage level of the first output signal OT1 into an external voltage level. More specifically, the first level conversion unit 341 is formed of an inverter INV and cross-coupled PMOS transistors PT1 and PT2 and NMOS transistors NT1 and NT2.

When the first output signal OT1 is at a high level, the NMOS transistor NT1 is turned on to turn on the PMOS transistor PT2, so the level of the signal that is input to the gate of a PMOS transistor PT3 of the first buffer 351 becomes high. When the first output signal OT1 is at a low level, the NMOS transistor NT2 is turned on, so the level of the signal that is input to the gate of an NMOS transistor NT3 of the first buffer 351 becomes low.

The second data latch 312 also includes the second data latch device 332, the second level conversion unit 342, and the second buffer 352. Since the structures of the second data latch device 332, the second level conversion unit 342, and the second buffer 352 are the same as those of the first data latch device 331, the first level conversion unit 341, and the first buffer 351, their descriptions will not be repeated here.

Here, the second data latch device 332 receives an odd buffer control signal PTRST_O, the odd clock CLK_O, and the odd data D_O. The odd buffer control signal PTRST_O controls the output of the odd data D_O. In other words, only when the odd buffer control signal PTRST_O is enabled to a high level is the effective odd data D_O output in response to the odd clock CLK_O.

The third data latch 313 includes the third data latch device 333, the third level conversion unit 343, and the third buffer 353. Since the structures of the third level conversion unit 343 and the third buffer 353 are the same as those of the first level conversion unit 341 and the first buffer 351, their descriptions will not be repeated here. The difference in the structures of the third data latch device 333 and the first data latch device 331 is that the third data latch device 333 includes a NAND gate NAND2 instead of the inverter IV2 and the NOR gate NOR2 of the first data latch device 331.

The fourth data latch 314 includes the fourth data latch device 334, the fourth level conversion unit 344, and the fourth buffer 354. Since the structures of the fourth data latch device 334, the fourth level conversion unit 344, and the fourth buffer 354 are the same as those of the third data latch device 333, the third level conversion unit 343, and the third buffer 353, their descriptions will not be repeated here.

The operation of the data output circuit of FIG. 5 will now be described.

First, it is assumed that the even buffer control signal PTRST_E and the odd buffer control signal PTRST_O are both enabled to a high level.

If the even data D_E is at a high level when the even clock CLK_E is at a rising edge or high level, the first data latch device 331 outputs signals of a low level and the third data latch device 333 outputs signals of a low level. Thus, the PMOS transistors of the first and third buffers 351 and 353 are turned on, and the voltage levels of first and second nodes N1 and N2 become high.

The first through fourth drivers 321 through 324 are formed in an inverter type. Thus, the outputs of the first and third buffers 351 and 353 are inverted to become the first pull-up control signal PB1 and the first pull-down control signal NB1. Therefore, the pull-up transistor PM1 is turned on according to the first pull-up control signal PB1 of a low level so that the data DQ of a high level is externally output.

If the even data D_E is at a low level when the even clock CLK_E is at a rising edge or high level, the first data latch device 331 outputs signals of a high level and the third data latch device 333 outputs signals of a high level. Thus, the NMOS transistors of the first and third buffers 351 and 353 are turned on, and the voltage levels of the first and second nodes N1 and N2 become low.

As a result, the pull-down transistor NM1 is turned on according to the first pull-down control signal NB1 of a high level, so the data DQ of a low level is externally output.

When the even clock CLK_E is at a rising edge or high level, the odd clock CLK_O is at a falling edge or low level. When the odd clock CLK_O is at a falling edge or low level, the signals of a high level and a low level are input to the PMOS transistor and the NMOS transistor in the second buffer 352, respectively. The same signals are input to the fourth buffer 354. Thus, when the even clock CLK_E is at a rising edge or high level, the second and fourth buffers 352 and 354 are in an off state.

When the odd clock CLK_O is at a rising edge or high level, the states of the first and second nodes N1 and N2 are determined according to the odd data D_O, so the output data is determined. When the odd data D_O is at a high level, the output data DQ of a high level is externally output, and when the odd data D_O is at a low level, the output data DQ of a low level is externally output.

When the odd clock CLK_O is at a rising edge or high level, the even clock CLK_E is at a falling edge or low level, so the first and third buffers 351 and 353 are in an off state.

When the even buffer control signal PTRST_E and the odd buffer control signal PTRST_O are disabled to a low level, the operations of the data output circuit are as follows.

When the even buffer control signal PTRST_E is at a low level, the NOR gate NOR2 of the first data latch device 331 outputs a signal of a low level. Thus, the NAND gate NAND1 outputs a signal of a high level to turn off the PMOS transistor PT3 of the first buffer 351. The level of the signal input to the NMOS transistor NT3 of the first buffer 351 is determined according to the even clock CLK_E. When the odd buffer control signal PTRST_O is at a low level, the PMOS transistor of the second buffer 352 is turned off, and the level of the signal input to the NMOS transistor of the second buffer 352 is determined according to the odd clock CLK_O as in the case of the first data latch device 331.

Thus, the NMOS transistor NT3 of the first buffer 351 or the NMOS transistor of the second buffer 352 is turned on according to the toggling of the even clock CLK_E and the odd clock CLK_O so that the level of the first node N1 becomes low. As a result, the first pull-up transistor PM1 is turned off.

When the even buffer control signal PTRST_E is at a low level, the NAND gate NAND2 of the third data latch device 332 outputs a signal of a high level. Thus, the NOR gate NOR1 outputs a signal of a low level, and the NMOS transistor of the third buffer 353 is turned off. The level of the signal input to the PMOS transistor of the third buffer 353 is determined according to the even clock CLK_E. When the odd buffer control signal PTRST_O is at a low level, the NMOS transistor of the fourth buffer 354 is turned off and the NMOS transistor of the fourth buffer 354 is turned off as in the case of the third data latch device 333. In addition, the level of the PMOS transistor of the fourth buffer 354 is determined according to the odd clock CLK_O.

Thus, the PMOS transistor of the third buffer 353 or the PMOS transistor of the fourth buffer 354 is turned on according to the toggling of the even clock CLK_E or the odd clock CLK_O, so the level of the second node N2 becomes high. In addition, the first pull-down transistor NM1 is turned off.

Therefore, when the even buffer control signal PTRST_E and the odd buffer control signal PTRST_O are disabled to a low level, the first pull-up transistor PM1 and the first pull-down transistor NM1 are turned off so that the first data output driver 410 outputs data of high impedance.

As described above, the data output buffer according to the present invention latches and outputs the odd data D_O and the even data D_E using one data input/output pin in the DDR mode.

Figure 6:
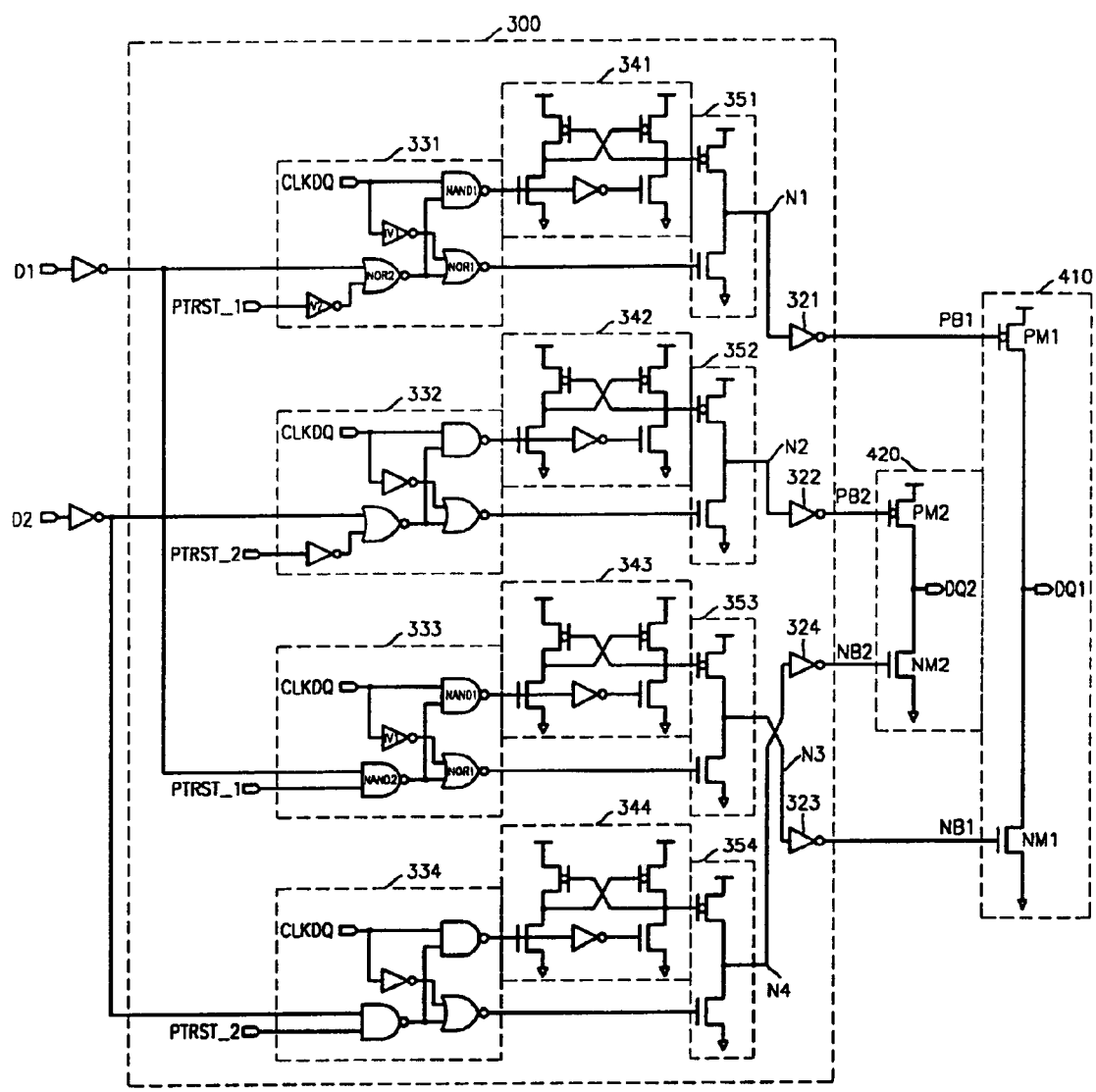
FIG. 6 is a circuit diagram illustrating a data output circuit for an SDR mode according to the embodiment of the invention.

FIG. 6 is a circuit diagram illustrating a data output circuit for the SDR mode according to an embodiment of the invention. In other words, the circuit of FIG. 6 is formed by setting the combined SDR/DDR data output circuit of FIG. 4 into the data output circuit for the SDR mode. The structure of the data output circuit of FIG. 6 is the same as that of the data output circuit of FIG. 5. Accordingly, the description of the structure of the data output circuit of FIG. 6 will not be repeated here. The differences between the data output circuit of FIG. 6 and the data output circuit of FIG. 5 are as follows.

Since the data output circuit of FIG. 6 is dedicated to the SDR mode, the first data output driver 410 is connected to the first and third data latches 311 and 313 of the data output buffer 300 via the first and third drivers 321 and 323, and the second data output driver 420 is connected to the second and fourth data latches 312 and 314 of the data output buffer 300 via the second and fourth drivers 322 and 324.

The operation of the data output circuit of FIG. 6 will now be described.

First, it is assumed that first and second buffer control signals PTRST_1 and PTRST_2 are enabled to a high level. Here, the first and second buffer control signals PTRST_1 and PTRST_2 control the output of first and second data D1 and D2, respectively. In other words, when the first and second buffer signals PTRST_1 and PTRST_2 are enabled at a predetermined level, i.e., the high level in the present invention, the effective first and second data D1 and D2 are output in response to a data output clock CLKDQ.

When the data output clock CLKDQ is at the rising edge or high level, the first and third data latch devices 311 and 333 receive the first data D1 and output signals for controlling the PMOS transistor and the NMOS transistor of the first and third buffers 351 and 353, respectively. In addition, the second and fourth latch devices 332 and 334 receive the second data D2 and output signals for controlling the PMOS transistor and the NMOS transistor of the second and fourth buffers 352 and 354, respectively.

When the first data D1 is at a high level, the first data latch device 331 outputs signals of a low level and the third data latch device 333 outputs signals of a low level. Thus, the PMOS transistors of the first and third buffers 351 and 353 are turned on, and the voltage levels of the first and third nodes N1 and N3 become high. Accordingly, the first pull-up transistor PM1 is turned on by the first pull-up control signal PB1 of a low level. As a result, the first output data DQ1 of a high level is externally output.

When the first data D1 is at a low level, the first data latch device 331 outputs signals of a high level and the third data latch device 333 outputs signals of a high level. Thus, the NMOS transistors of the first and third buffers 351 and 353 are turned on, and the voltage levels of the first and third nodes N1 and N3 become low. Accordingly, the first pull-down transistor NM1 is turned on by the first pull-down control signal NB1 of a high level. As a result, the first output data DQ1 of a low level is externally output.

When the second data D2 is at a high level, the second data latch device 332 outputs signals of a low level, and the fourth data latch device 334 outputs signals of a low level. Thus, the PMOS transistors of the second and fourth buffers 352 and 354 are turned on, and the voltage levels of the second and fourth nodes N2 and N4 become high. Accordingly, the second pull-up transistor PM2 is turned on by the second pull-up control signal PB2 of a low level. As a result, the second output data DQ2 of a high level is externally output.

When the second data D2 is at a low level, the second data latch device 332 outputs signals of a high level, and the fourth data latch device 334 outputs signals of a high level. Thus, the NMOS transistors of the second and fourth buffers 352 and 354 are turned on, and the voltage levels of the second and fourth nodes N2 and N4 become low. Accordingly, the second pull-down transistor NM2 is turned on by the second pull-down control signal NB2 of a high level. As a result, the second output data DQ2 of a low level is externally output.

When the first and second buffer control signals PTRST_1 and PTRST_2 are disabled to a low level, the operation of the data output circuit of FIG. 6 is similar to that of the data output circuit of FIG. 5 in the case where the even buffer control signal PTRST_E and the odd buffer control signal PTRST_O are disabled to a low level.

Thus, when the first and second buffer control signals PTRST_1 and PTRST_2 are disabled to a low level, the first and second pull-up transistors PM1 and PM2 and the first and second pull-down transistors NM1 and NM2 are turned off, so the first and second data output drivers 410 and 420 output data of high impedance.

As described above, the data output buffer according to the present invention latches and outputs two bits of data using two data input/output pins in the SDR mode.

As shown in FIGS. 5 and 6, the structures of the data output circuits for the DDR mode and the SDR mode are the same. However, in the data output circuit for the DDR mode, the second data output driver 420 is not connected to the data output buffer. In addition, by connecting the second data output driver 420 to the data output buffer 300 in the data output circuit for the SDR mode, the portion of the circuit that latches and outputs the even data D_E is used as the circuit that latches and outputs the first data D1, and the portion of the circuit that latches and outputs the odd data D_O is used as the circuit that latches and outputs the second data D2.

Since the data output circuit according to the invention does not require the dedicated SDR data output buffer, the efficiency of the data output buffer is improved.

Figure 1:
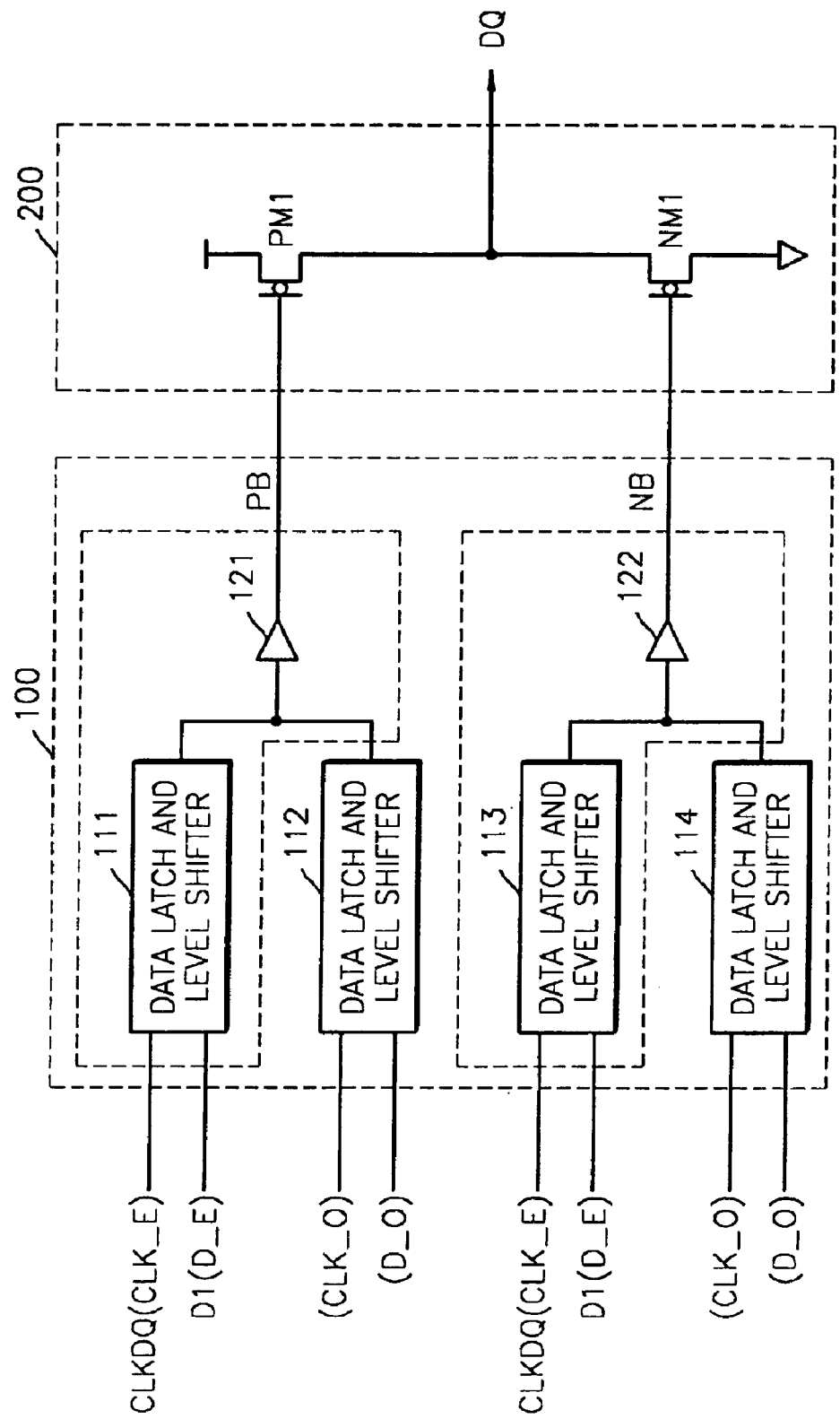
FIG. 1 is a block diagram illustrating a data output circuit in a conventional combined single data rate/double data rate (SDR/DDR) semiconductor memory device.
Figure 2:
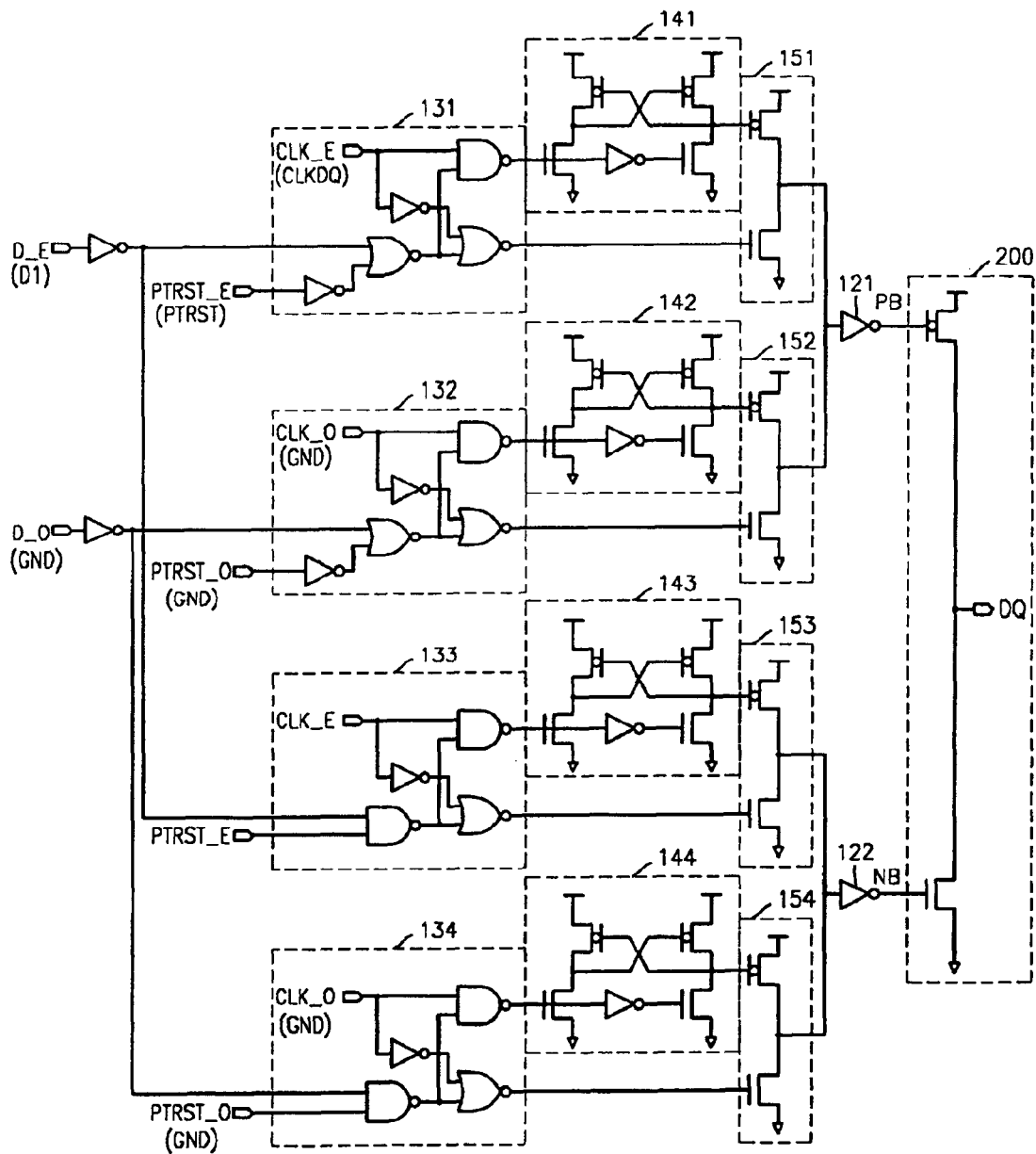
FIG. 2 is a circuit diagram illustrating a combined SDR/DDR data output circuit in a conventional combined SDR/DDR semiconductor memory device.
Figure 3:
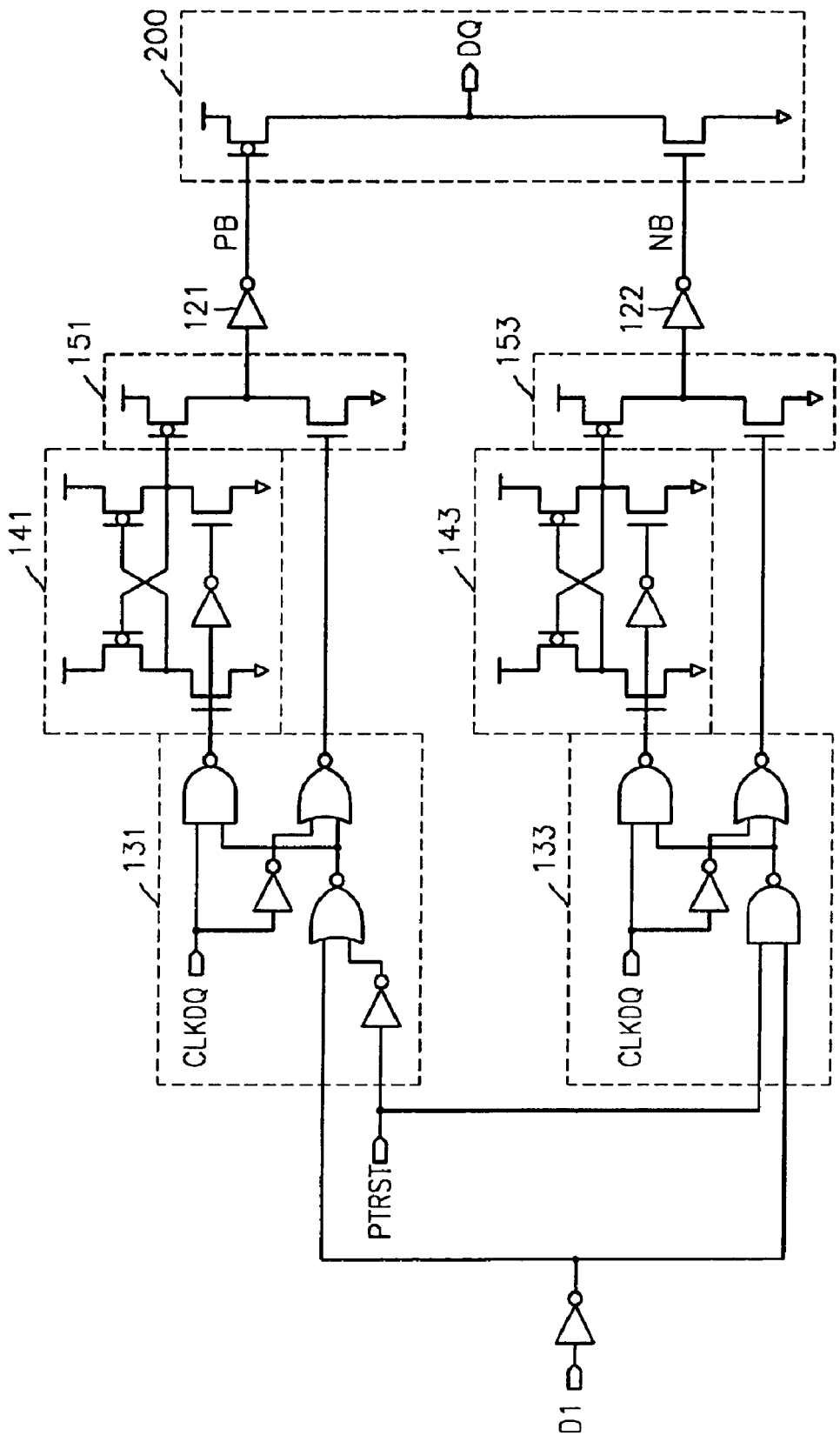
FIG. 3 is a circuit diagram illustrating a dedicated SDR data output circuit in a conventional combined SDR/DDR semiconductor memory device.

The effects of the invention can be made clearer when comparing the invention with the conventional data output circuits of FIGS. 2 and 3.

Referring to FIGS. 2 and 5, the structures of the conventional combined SDR/DDR data output circuit and the data output circuit for the DDR mode according to the present invention are the same except that the second data output driver 420 is excluded in FIG. 5.

The operations of the data output circuits of FIGS. 2 and 5 are the same in the DDR mode.

On the other hand, in the SDR mode, the portion of the circuit that is related to the output of the odd data D_O is not used in the data output circuit of FIG. 2. More specifically, in the SDR mode, the terminals for receiving the odd data D_O, the odd buffer control signal PTRST_O, and the odd clock CLK_O are grounded and fixed at a low level. In addition, the data output clock CLKDQ instead of the even clock CLK, the first data D1 instead of the even data D_E, and the buffer control signal PTRST instead of the even buffer control signal PTRST_E are input, so that the data output circuit of FIG. 2 operates in the SDR mode.

Thus, only the first and third data latch devices 131 and 133, the first and third level conversion units 141 and 143, and the first and third buffer 151 and 153 are operated; however, the second and fourth data latch devices 132 and 134, the second and fourth level conversion unit 142 and 144, and the second and fourth buffers 152 and 154 are not operated.

Thus, the conventional data output circuit of FIG. 2 requires the dedicated SDR data output circuit as shown in FIG. 3.

However, the data output circuit according to embodiments of the the invention can be set as shown in FIG. 5 for the DDR mode and as shown in FIG. 6 for the SDR mode. In other words, the data output circuit according to embodiments of the invention can be used in both the DDR mode and the SDR mode.

The conventional data output circuit requires both the data output circuits of FIGS. 2 and 3. Here, the data output circuit of FIG. 2 can be used in both the DDR mode and the SDR mode; however, the data output circuit of FIG. 3 is used only in the SDR mode. Thus, the required number of data output buffers is increased, and the size of the semiconductor memory device is increased.

In contrast, embodiments of the invention decrease the required number of data buffers, thereby decreasing the size of the semiconductor memory device.

Figure 7:
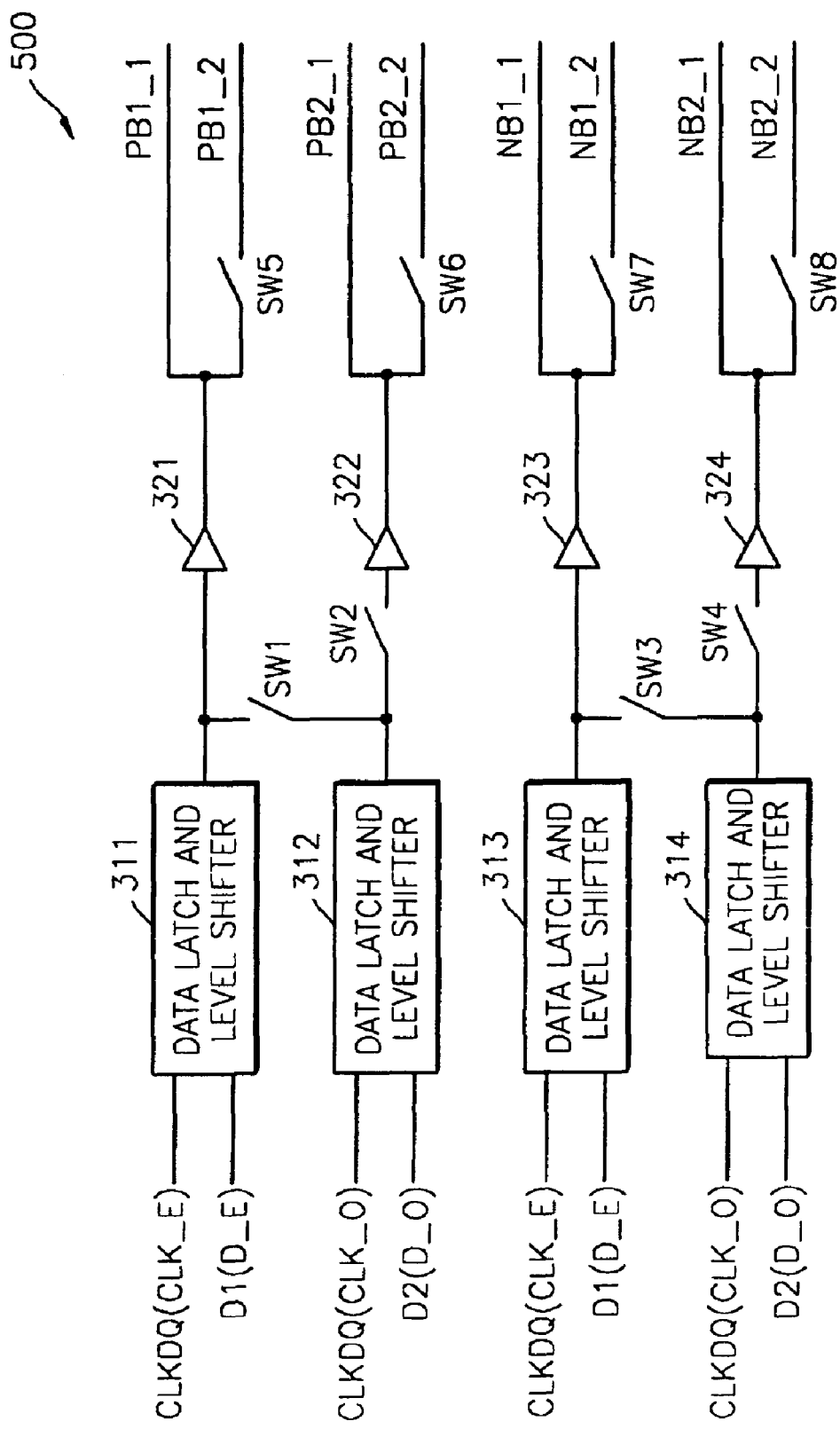
FIGS. 7 and 8 are block diagrams illustrating a data output circuit in a semiconductor memory according to another embodiment of the invention.
Figure 8:
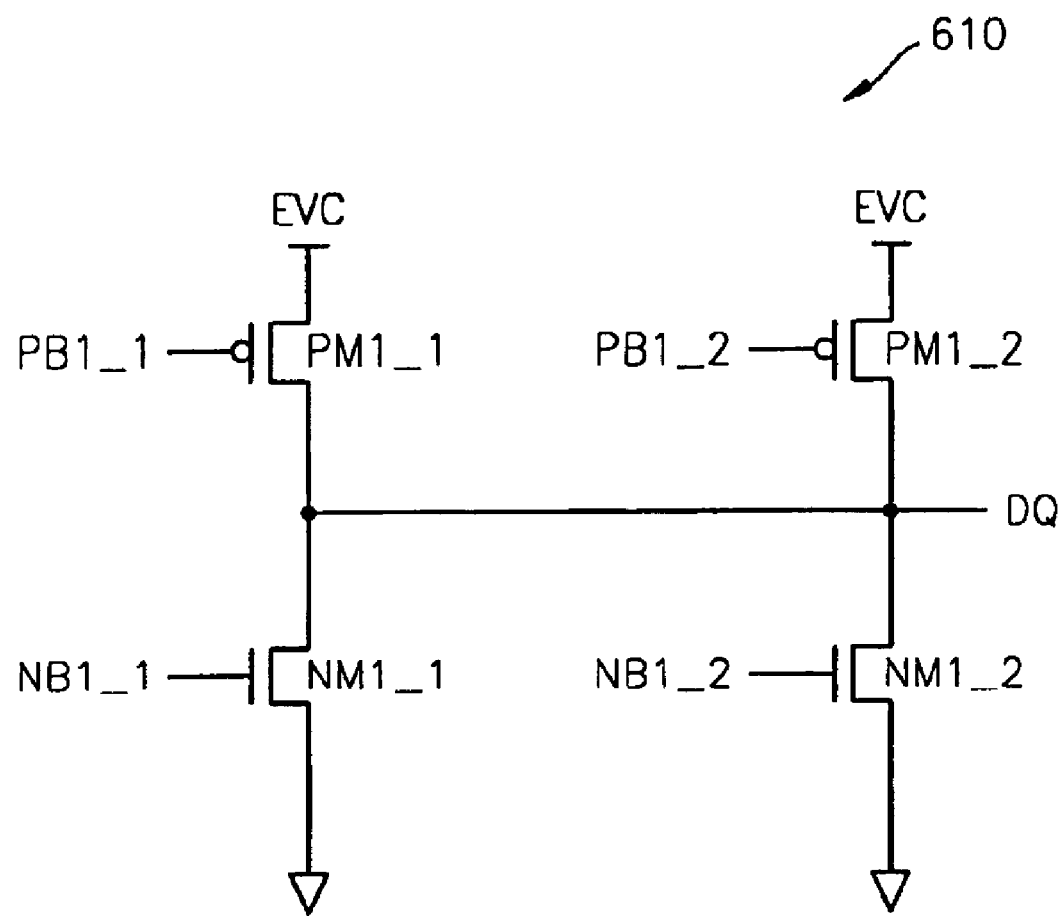

FIGS. 7 and 8 are block diagrams illustrating a data output circuit of a semiconductor memory device according to other embodiments of the invention. The data output circuit of the semiconductor memory device according to another embodiment of the invention includes a data output buffer 500, a first data output driver 610, and a second data output driver (not shown).

The structure of the data output buffer 500 of FIG. 7 is similar to that of the data output buffer 300 of FIG. 3 except that switches SW5 through SW8 are further included. Drivers 321 through 324 drive the data received from data latches 311 through 314 to output pull-up control signals PB1_1 and PB2_1 and pull-down control signals NB1_1 and NB2_1. When the switches SW5 through SW8 are in an on state, pull-up control signals PB 1_2 and PB2_2 and pull-down control signals NB1_2 and NB2_2 that are same as the pull-up control signals PB1_1 and PB1_2 and the pull-down control signals NB1_1 and NB1_2 are generated.

The first data output driver 610 of FIG. 8 includes two pull-up transistors PM1_1 and PM1_2 and two pull-down transistors NM1_1 and NM1_2. The pull-up transistors PM1_1 and PM1_2 are turned on in response to the pull-up control signals PB1_1 and PB1_2, respectively, to output output data DQ of a high level. The pull-down transistors NM1_1 and NM1_2 are turned on in response to the pull-down control signals NB1_1 and NB1_2, respectively, to output the output data DQ of a low level.

In another embodiment of the invention illustrated in FIG. 8, one data output driver 610 includes two pull-up transistors PML_1 and PM1_2 and two pull-down transistors NM1_1 and NM1_2. However, the number of pull-up transistors and pull-down transistors may vary.

According to embodiments of the invention, the required number of data buffers is decreased by merging the data output buffers in the combined SDR/DDR semiconductor memory device. Thus, the size of the semiconductor memory device is decreased. In addition, by reducing the number of data buffers, a skew between the signals that drive the data output driver is reduced.

Embodiments of the invention will now be described in a non-limiting way.

In accordance with an aspect of the invention, there is provided a data output circuit in a combined SDR/DDR semiconductor memory device, the data output circuit includes: first and third data latches that latch even data in response to an even clock and generate a first pull-up control signal and a first pull-down control signal, respectively, in a DDR mode, and latch first data in response to a data output clock and generate the first pull-up control signal and the first pull-down signal, respectively, in an SDR mode; second and fourth data latches that latch odd data in response to an odd clock and generate the first pull-up control signal and the first pull-down control signal, respectively, in the DDR mode, and latch second data in response to the data output clock and generate a second pull-up control signal and a second pull-down signal, respectively, in the SDR mode; a first data output driver, which drives a first output pad to a predetermined voltage level in response to the first pull-up control signal and the first pull-down control signal; and a second data output driver, which drives a second output pad to a predetermined voltage level in response to the second pull-up control signal and the second pull-down control signal.

According to an embodiment of the invention, the second data output driver may be electrically connected to the second and fourth data latches in the SDR mode and may be separated from the second and fourth data latches in the DDR mode.

Another data output circuit in a combined SDR/DDR semiconductor memory device according to another aspect of the invention includes: a data output buffer, which latches and outputs data output from a memory cell; and data output drivers, which generate output data in response to an output signal of the data output buffer, wherein the data output buffer includes: an even data output buffer unit that latches and outputs even data, which will be output to a first data pin, in response to an even clock in a DDR mode, and latches and outputs first data, which will be output to the first data pin, in response to a data output clock in an SDR mode; and an odd data output buffer unit that latches and outputs odd data, which will be output to the first data pin, in response to an odd clock in the DDR mode, and latches and outputs second data, which will be output to a second data pin, in response to the data output clock.

An embodiment of the invention may further include: a first data output driver, which is electrically connected to the even data output buffer unit and the odd data output buffer unit in the DDR mode and is connected to the even data output buffer unit and separated from the odd data output unit in the SDR mode; and a second data output driver, which is electrically connected to the odd data output buffer unit in the SDR mode.

A data output circuit in a combined SDR/DDR semiconductor memory device according to still another embodiment of the invention includes: a data output buffer, which latches and outputs data output from a memory cell; and first and second data output drivers, which drive first and second output pads to a predetermined voltage level in response to an output signal of the data output buffer, wherein the data output buffer includes a first data output buffer unit and a second data output buffer unit, wherein the first and second data output buffer units are electrically connected to the first data output driver and latch even data and odd data that will be output to the first output pad in response to the rising edge and the falling edge of a clock signal, in a DDR mode, and the first data output buffer unit is electrically connected to the first data output driver and latches the data that will be output to the first output pad in response to the rising edge or the falling edge of the clock signal, and the second data output buffer unit is electrically connected to the second data output driver and latches the data that will be output to the second output pad in response to the rising edge or the falling edge of the clock signal, in an SDR mode.

The above data output circuit may further include: a first clock buffer, which generates the even clock in response to the rising edge of the clock in the DDR mode; and a second clock buffer, which generates the odd clock in response to the falling edge of the clock in the DDR mode, wherein the first clock buffer is used to generate the data output clock in the SDR mode.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A data output circuit in a combined single data rate/double data rate (SDR/DDR) semiconductor memory device, the data output circuit comprising:
    a first and a third data latch that latch even data in response to an even clock and generate a first pull-up control signal and a first pull-down control signal, respectively, in a DDR mode, and that latch first data in response to a data output clock and generate the first pull-up control signal and the first pull-down signal, respectively, in an SDR mode;
    a second and a fourth data latch that latch odd data in response to an odd clock and generate the first pull-up control signal and the first pull-down control signal, respectively, in the DDR mode, and that latch second data in response to the data output clock and generate a second pull-up control signal and a second pull-down signal, respectively, in the SDR mode;
    a first data output driver that drives a first output pad to a predetermined voltage level in response to the first pull-up control signal and the first pull-down control signal; and
    a second data output driver that drives a second output pad to a predetermined voltage level in response to the second pull-up control signal and the second pull-down control signal.

2. The data output circuit of claim 1, wherein the second data output driver is electrically connected to the second and fourth data latches in the SDR mode and is separated from the second and fourth data latches in the DDR mode.

3. The data output circuit of claim 2, wherein the data output circuit comprises:
    a first switch that connects the second data latch to the first data output driver in the DDR mode;
    a second switch that connects the second data latch to the second data output driver in the SDR mode;
    a third switch that connects the fourth data latch to the first data output driver in the DDR mode; and
    a fourth switch that connects the fourth data latch to the second data output driver in the SDR mode.

4. The data output circuit of claim 1, further comprising:
    a first clock buffer that generates the even clock in response to the rising edge of a clock in the DDR mode; and
    a second clock buffer that generates the odd clock in response to the falling edge of the clock in the DDR mode,
    wherein the first clock buffer is used to generate the data output clock in the SDR mode.

5. The data output circuit of claim 1, wherein the first, second, third, and fourth data latches generate the first and second pull-up control signals and the first and second pull-down control signals that turn off the first and second data output drivers when a predetermined buffer control signal is in an inactive state.

6. The data output circuit of claim 1, wherein the first and second data output drivers comprise at least two pull-up transistors that are connected in parallel and at least two pull-down transistors that are connected in parallel, respectively.

7. A data output circuit in a combined SDR/DDR semiconductor memory device, the data output circuit comprising:
    a data output buffer that latches and outputs data output from a memory cell; and
    a first and a second data output drivers that generate output data in response to an output signal of the data output buffer,
    wherein the data output buffer comprises:
        an even data output buffer unit that latches and outputs even data, which will be output to a first data pin, in response to an even clock in a DDR mode, and that latches and outputs first data, which will be output to the first data pin, in response to a data output clock in an SDR mode; and an odd data output buffer unit that latches and outputs odd data, which will be output to the first data pin, in response to an odd clock in the DDR mode, and that latches and outputs second data, which will be output to a second data pin, in response to the data output clock.

8. The data output circuit of claim 7, wherein:

the first data output driver is electrically connected to the even data output buffer unit and the odd data output buffer unit in the DDR mode and is connected to the even data output buffer unit and separated from the odd data output unit in the SDR mode; and the second data output driver is electrically connected to the odd data output buffer unit in the SDR mode.

9. The data output circuit of claim 8, further comprising:

a first clock buffer that generates the even clock in response to the rising edge of a clock in the DDR mode; and a second clock buffer that generates the odd clock in response to the falling edge of the clock in the DDR mode, wherein the first clock buffer is used to generate the data output clock in the SDR mode.

10. The data output circuit of claim 8, wherein the first and second data output drivers are turned off when a predetermined buffer control signal is in an inactive state, so as to output output data of high impedance.

11. The data output circuit of claim 8, wherein the first and second data output drivers comprise at least two pull-up transistors that are connected in parallel and at least two pull-down transistors that are connected in parallel, respectively.

12. A data output circuit in a combined SDR/DDR semiconductor memory device, the data output circuit comprising:

a data output buffer that latches and outputs data output from a memory cell; and first and second data output drivers that drive first and second output pads to a predetermined voltage level in response to an output signal of the data output buffer, wherein the data output buffer includes a first data output buffer unit and a second data output buffer unit, wherein, in a DDR mode, the first and second data output buffer units are electrically connected to the first data output driver and latch even data and odd data that will be output to the first output pad in response to the rising edge and the falling edge of a clock signal, and wherein, in a SDR mode, the first data output buffer unit is electrically connected to the first data output driver and latches the data that will be output to the first output pad in response to the rising edge or the falling edge of the clock signal, and the second data output buffer unit is electrically connected to the second data output driver and latches the data that will be output to the second output pad in response to the rising edge or the falling edge of the clock signal.

13. The data output circuit of claim 12, further comprising:

a first clock buffer that generates the even clock in response to the rising edge of the clock in the DDR mode; and a second clock buffer that generates the odd clock in response to the falling edge of the clock in the DDR mode, wherein the first clock buffer is used to generate the data output clock in the SDR mode.

14. The data output circuit of claim 12, wherein the first and second data output drivers are turned off when a predetermined buffer control signal is in an inactive state, so as to output output data of high impedance.

15. The data output circuit of claim 12, wherein the first and second data output drivers comprise at least two pull-up transistors that are connected in parallel and at least two pull-down transistors that are connected in parallel, respectively.

16. A method of operating a data output circuit configured to run in a combined single data rate/double data rate (SDR/DDR) semiconductor device comprising:

during a DRR mode, latching even data in response to an even clock using a first data latch and a third data latch;

during the DRR mode, latching odd data in response to an odd clock using a second data latch and a fourth data latch;

during a SDR mode, latching first data in response to a data output clock using the first data latch and the third data latch;

during the SDR mode, latching second data in response to the data output clock using the second data latch and the fourth data latch;

during the DDR mode, generating a first pull-up control signal and a first pull-down control signal using the first and third data latches, respectively, and also generating the first pull-up control signal and the first pull-down control signal using the second and fourth data latches, respectively;

during the SDR mode, generating the first pull-up control signal and the first pull-down control signal using the first and the third data latches, respectively, and generating a second pull-up control signal and a second pull-down control signal using the second and the fourth data latches, respectively;

driving a first output pad to a predetermined voltage level with a first data output driver in response to the first pull-up control signal and the first pull-down control signal; and driving a second output pad to a predetermined voltage level with a second data output driver in response to the second pull-up control signal and the second pull-down control signal.

17. The method of claim 16, further comprising:

electrically connecting the second data output driver to the second data latch and the fourth data latch in the SDR mode and electrically separating the second data output driver from the second data latch and the fourth data latch in the DDR mode.

18. The method of claim 17, further comprising:

during the DDR mode, connecting the first data output driver to the second data latch and the fourth data latch with a first switch and a third switch, respectively; and during the SDR mode, connecting the second data output driver to the second data latch and the fourth data latch with a second switch and a fourth switch, respectively.

19. The method of claim 16, further comprising:

in the DDR mode, generating, with a first clock buffer, the even clock in response to the rising edge of a clock and generating, with a second clock buffer, the odd clock in response to the falling edge of the clock, wherein the first clock buffer is also used to generate the data output clock in the SDR mode.

20. The method of claim 16, wherein the first pull-up control signal, the second pull-up control signal, the first pull-down control signal, and the second pull-down control signal are configured to turn off the first and second data output drivers when a predetermined buffer control signal is in an inactive state.

21. The method of claim 16, wherein driving a first output pad to a predetermined voltage level with a first data output driver comprises using at least two pull-up transistors that are connected in parallel; and wherein driving a second output pad to a predetermined voltage level with a second data output driver comprises using at least two pull-down transistors.

* * * * *

UNITED STATES PATENT AND TRADEMARK OFFICE
CERTIFICATE OF CORRECTION

PATENT NO. : 6,870,776 B2 Page 1 of 1
APPLICATION NO. : 10/631414
DATED : March 22, 2005
INVENTOR(S) : Kim et al.

It is certified that error appears in the above-identified patent and that said Letters Patent is hereby corrected as shown below:

At column 10, line 31, please replace "PML_1" with --PM1_1--

Signed and Sealed this

Fifth Day of September, 2006

JON W. DUDAS
*Director of the United States Patent and Trademark Office*